(12) United States Patent
Furukawa et al.

(10) Patent No.: US 6,791,118 B2
(45) Date of Patent: *Sep. 14, 2004

(54) SEMICONDUCTOR LIGHT EMITTING ELEMENT AND MANUFACTURING METHOD THEREOF

(75) Inventors: Chisato Furukawa, Atsugi (JP); Hideto Sugawara, Kawasaki (JP); Nobuhir Suzuki, Tokyo-To (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/602,099

(22) Filed: Jun. 23, 2003

(65) Prior Publication Data

US 2004/0079955 A1 Apr. 29, 2004

Related U.S. Application Data

(60) Continuation of application No. 10/281,852, filed on Oct. 28, 2002, now Pat. No. 6,627,521, which is a division of application No. 09/745,250, filed on Dec. 20, 2000, now Pat. No. 6,504,181.

(30) Foreign Application Priority Data

Dec. 21, 1999 (JP) .......................................... 11-362839

(51) Int. Cl.⁷ ............................................... H01L 31/00
(52) U.S. Cl. ......................................... 257/98; 438/103
(58) Field of Search .............................. 257/94, 96, 98, 257/103

(56) References Cited

U.S. PATENT DOCUMENTS

| | | | |
|---|---|---|---|
| 5,813,752 A | 9/1998 | Singer et al. | 362/293 |
| 5,998,925 A | 12/1999 | Shimizu et al. | 313/503 |
| 6,340,824 B1 | 1/2002 | Komoto et al. | 257/99 |
| 6,404,125 B1 | 6/2002 | Garbuzov et al. | 313/499 |
| 6,603,146 B1 * | 8/2003 | Hata et al. | 257/79 |

* cited by examiner

*Primary Examiner*—Savitri Mulpuri
(74) *Attorney, Agent, or Firm*—Hogan & Hartson, LLP (57) ABSTRACT

There is disclosed a semiconductor light emitting element formed by selective growth and being high in light emitting efficiency, in which at least one GaN-based layer grown by ELO in stacked/formed on a sapphire substrate, and a fluorescent substance for converting an ultraviolet light to a visible light is contained in a selective growth mask material layer for use in this case. Since this fluorescent substance converts the ultraviolet light to the visible light, a binding efficiency of the ultraviolet light to the fluorescent substance is enhanced in either one of a center light emitting type and UV light emitting type of light emitting elements. By further containing the fluorescent substance into a passivation film, the efficiency is further enhanced.

10 Claims, 6 Drawing Sheets

SEMICONDUCTOR LIGHT EMITTING ELEMENT AND MANUFACTURING METHOD THEREOF

This application is a continuation of U.S. patent application Ser. No. 10/281,852 filed Oct. 28, 2002 now U.S. Pat. No. 6,627,521 which is a divisional of U.S. patent application Ser. No. 09/745,250 filed Dec. 20, 2000 now U.S. Pat. No. 6,504,181.

CROSS-REFERENCE TO RELATED APPLICATION

This application claims benefit of priority under 35 U.S.C. §119 to Japanese Patent Application No. Hei11-362839 (1999), filed on Dec. 21, 1999, the entire contents of which are incorporated by reference herein.

BACKGROUND OF THE INVENTION

The present invention relates to a semiconductor light emitting element and a manufacturing method thereof, and more specifically, to a semiconductor light emitting element which is suitable for a semiconductor light emitting apparatus with a high light emitting efficiency.

A storage apparatus utilizing an optical recording has a large storage capacity and is characterized by a long life and a high reliability due to non-contact, so that this type of apparatus is broadly utilized. As the light for use herein has a shorter wavelength, a recording density can be raised, and hence, blue to green light emitting elements are to be used. Moreover, some novel light emitting elements have been realized such as white LED's which obtain a white light by combining a blue LED with a YAG fluorescent substance.

An the blue to green light emitting elements, a light emitting diode (LED) and a laser diode (LD) having a high luminance have been now obtained with a GaN-based material.

As a crystal growth technique of this GaN-bused light emitting element, much attention has been paid to epitaxially laterally overgrown (ELO) in recent years.

Figure 11A:
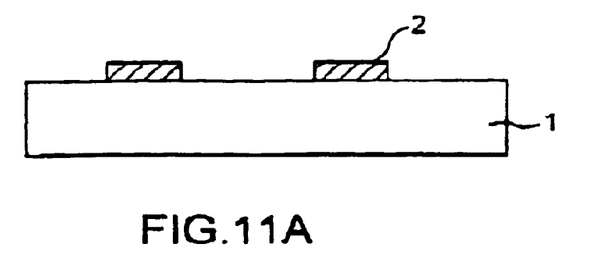
FIGS. 11A to 11D are step sectional views showing a growth state by an ELO mask and ELO.
Figure 11B:
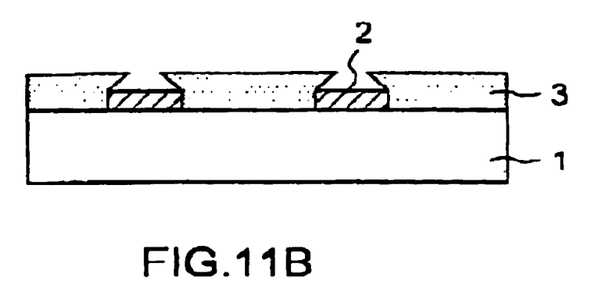
Figure 11C:
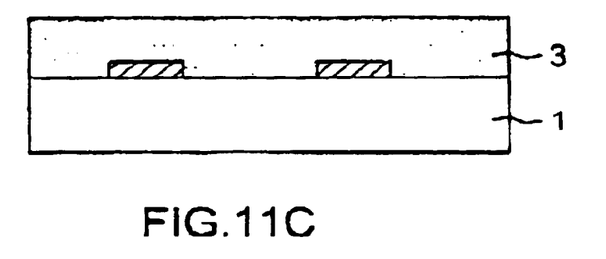
Figure 11D:
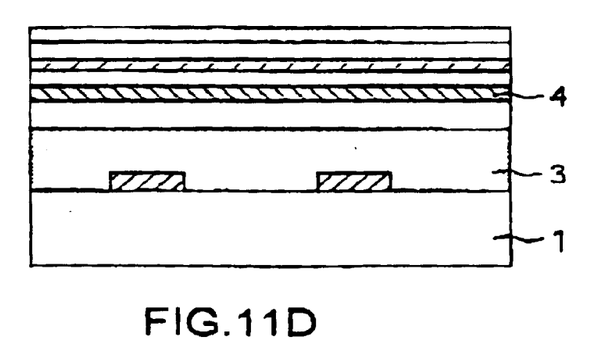

FIG. 11A is a sectional view showing an outline of a growth state in ELO. First, a selective growth mask 2 is formed an a sapphire substrate 1 (FIG. 11A), and the growth of a GaN-based film is then performed with ELO, so that for a crystal defect, the GaN-based film grows so as to embed the selective growth mark owing to a difference or a growth speed in ELO between lateral and vertical directions (FIGS. 11B and 11D). Moreover, in this case, since the crystal defect is generated along with the fast lateral direction growth, there is very little transition in the Gan film by ELO on the selective growth mask. When an epitaxial layer is stacked onto this film to obtain an element structure (FIG. 11D), a defect density of a substrate is very low, and therefore a semiconductor light emitting element having excellent light emitting properties can be obtained.

In a light emitting center (D/A) type blue LED structure of the light emitting diodes (LED) with the high luminance in which such a GaN-based material is used, InGaN which is an active layer is doped with Si as a donor and Zn, Mg or the like as an acceptor, a desired light emitting wavelength is to be obtained in a light emitting center, not in a band end, and therefore in addition to a visible light, numerous ultraviolet (UV) lights are generated. That is to say, in the case of In 13% in the composition of this active layer, the light emitting wavelength in the band end of a center wavelength 400 nm is about 365 nm, but besides the ultraviolet light from the light emitting center, the ultraviolet light from this band end is also present, and as injection current is increased, a proportion of the light emitted from the band end increases. However, this ultraviolet light is not effectively utilized, so that a light extraction efficiency remains at a low level.

Moreover, in a UV light emitting LED which decreases in composition and generates only the ultraviolet light from the active layer, the generated ultraviolet light is not effectively extracted, and an external quantum efficiency remains to be low. Furthermore, the aforementioned ELO technique is utilized only for transition reduction.

Additionally, in order to enhance the light emitting efficiency, in the GaN-based semiconductor light emitting element, it has been proposed to contain the fluorescent substance at least one of p-type and n-type semiconductor layers (Japanese Patent Application Laid-Open No. 82849/2000).

However, it is difficult in manufacture to contain a particulate fluorescent substance in the semiconductor layer generally formed by vapor phase growth.

SUMMARY OF THE INVENTION

The present invention has been developed to solve the problem, and an object thereof is to provide a semiconductor light emitting apparatus high in light extraction efficiency.

According to the present invention, there is provided a semiconductor light emitting element comprising, as a lamination structure:

an insulating substrate;

GaN-based stacked films stacked/formed on said insulating substrate, one of these films being a GaN-based films grown by using a selective growth mask material layer containing a fluorescent substance for converting an ultraviolet light to a visible light; and an active layer, formed on the GaN-based stacked films, for emitting at least an ultraviolet light component.

According to the semiconductor light emitting element, since a fluorescent substance is mixed beforehand into a selective growth mask layer for ELO, it is possible to convert an ultraviolet light which has heretofore failed to be effectively utilized to a visible light in the vicinity of an active layer, and a bonding efficiency with the fluorescent substance can remarkably be enhanced.

A topmost layer may further preferably be provided with a protective layer containing the fluorescent substance, and a light emitting efficiency can further be enhanced by raising a conversion efficiency to the visible light from the ultraviolet light.

A lens may be formed on an insulating substrate back surface side, thereby it is possible to extract the light from the back-surface side, and the present invention can also be applied to flip chip mounting or the like.

A thickness of the selective growth mask layer containing the fluorescent substance may be 50 nm or more, 20 $\mu$m or less.

DESCRIPTION OF THE PREFERRED EMBODIMENTS

An embodiment of the present invention will be described hereinafter in detail with reference to the drawings.

Figure 1:
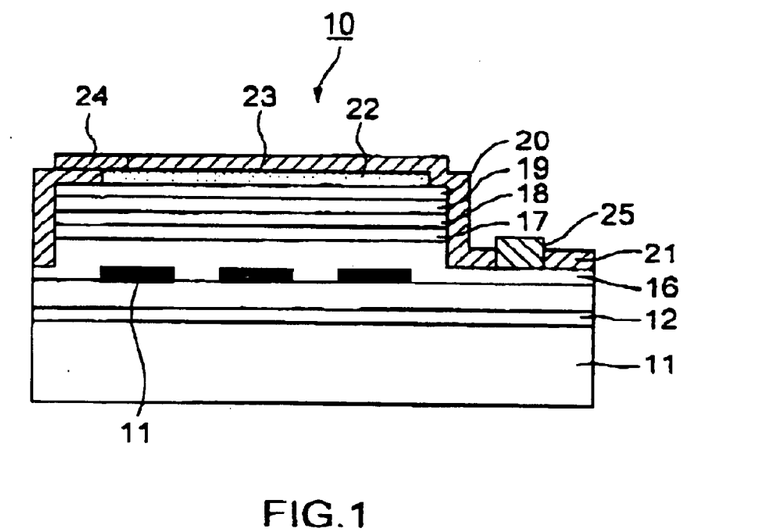
FIG. 1 is an element sectional view showing a constitution of a semiconductor light emitting element according to the present invention.

FIG. 1 in a sectional view showing a structure of a semiconductor light emitting element 10 according to the present invention.

A GaN buffer layer 12 and n-GaN layer 13 are stacked on a sapphire substrate 11, on the layers an ELO mask layer 15 formed of $SiO_2$ uniformly mixed with a fluorescent substance is stacked, on the layer an n-GaN layer 16 formed using the mask with ELO, further an InGaN active layer 17, p-AlGaN gap layer 18, p-GaN clad layer 19 and $p^+$-GaN contact layer 20 are stacked, a transparent electrode 22 is formed on a light extraction surface of the $p^+$-GaN contact layer 20, a p-electrode 24 to contact the transparent electrode and an n-electrode 25 on the exposed n-GaN layer 16 are formed, and the entire surface is covered with passivation films 21 and 23. This passivation film is also mixed with the fluorescent material.

Additionally, the active layer is here an $Al_xIn_yGa_{1-x-y}N$ ($0 \leq x 0.1 \leq y \leq 1$) film, but various films such as a $B_xGa_{1-x}N$ ($0 \leq z \leq 1$) film can be used.

Figure 2:
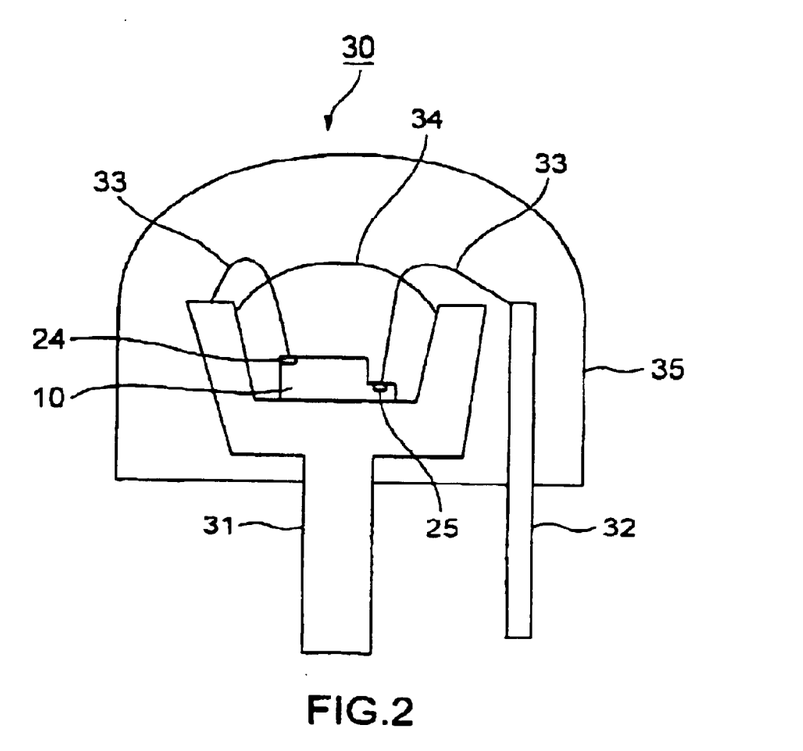
FIG. 2 is a sectional view showing a structure of a semiconductor light emitting apparatus using the semiconductor light emitting element shown in FIG. 1.

FIG. 2 is a sectional view showing a constitution of a semiconductor light emitting apparatus 30 using the semiconductor light emitting element 10 of the present invention.

The semiconductor light emitting element 10 is mounted on a stem 31, and the p-electrode 24 of the semiconductor light emitting element 10 is connected to the stem 31 and the n-electrode 25 is connected to a lead 32 via wires 33, respectively. Moreover, the entire apparatus is covered with a cap 35.

Figure 3:
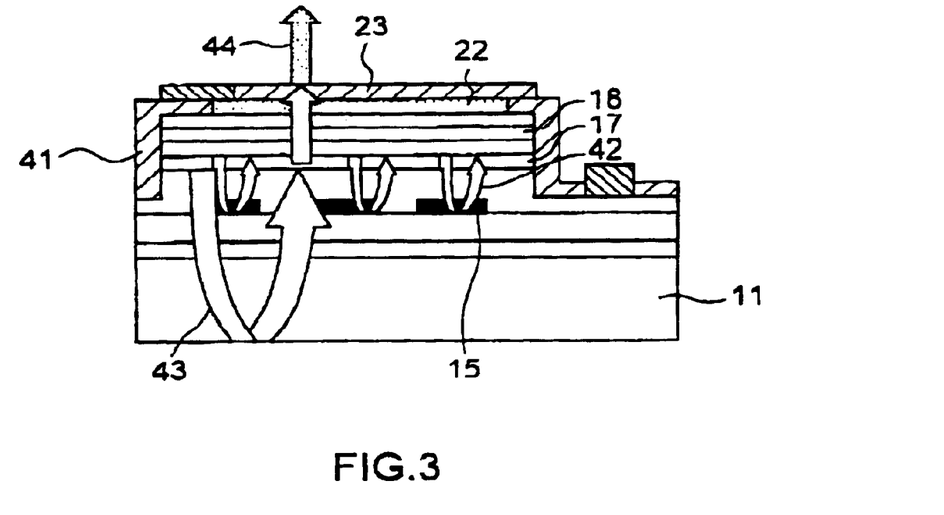
FIG. 3 is a schematic view showing a light emitting operation in the semiconductor light emitting element according to the present invention.

FIG. 3 is a schematic view showing a light emitting operation of the semiconductor light emitting element shown in FIG. 1. Here, a light emitting center type will be described.

A light emitted from the InGaN active layer 17 as a light emitting layer is discharged in all directions (spherical shape) and an ultraviolet light component hits the fluorescent substance contained in the passivation film 23 and is converted to a visible light. Specifically, the fluorescent substance also serves as a light emitting source.

Additionally, a light 43 turning directly to a substrate side from the active layer 17 is reflected by an insulating substrate bottom surface, that is, a lead frame reflective surface, and is extracted from above.

As a result, since apart of the ultraviolet light component in a light 44 finally discharged from the light emitting element serves as a visible light component, a light emitting amount as the visible light increases.

Figure 4:
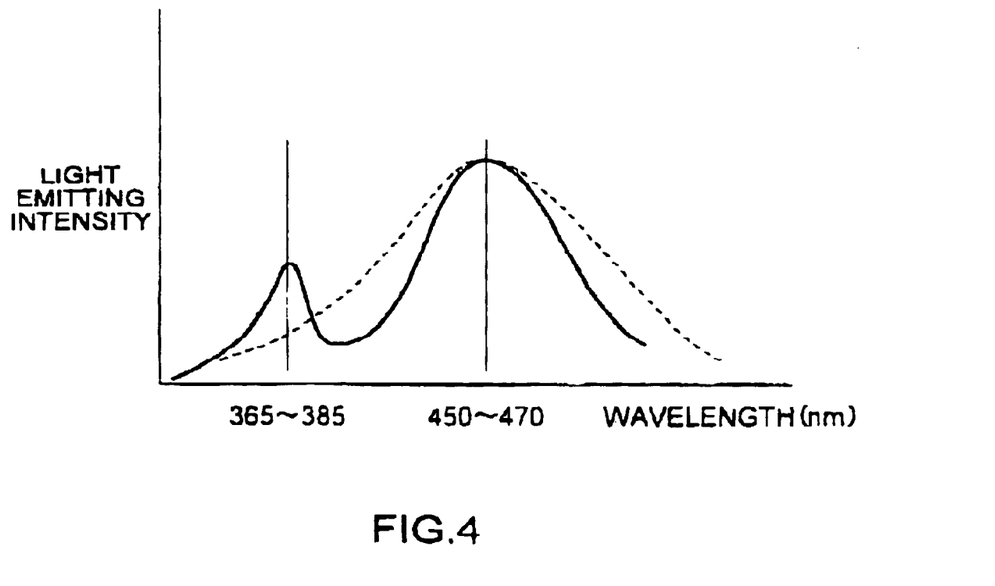
FIG. 4 is a graph showing a light emitting intensity distribution of the semiconductor light emitting element shown in FIG. 3.

FIG. 4 is a graph showing this state. In the light emitting apparatus of a usual center light emitting type shown by a solid line, a light emitted from the active layer has peaks in a visible light band and ultraviolet light band, while in the light emitting apparatus of the present invention shown by a broken line, the peaks are reduced to one by using the fluorescent substance in the ELO mask to perform conversion, and it is seen that the light emitting amount in the visible light band increases.

Moreover, to contain the fluorescent substance in the ELO mask material in this manner is easier in manufacture than to contain the fluorescent substance in the semiconductor layer, as proposed conventionally.

Additionally, since a GaN-based material and sapphire substrate 11 are both transparent to the visible light, the converted light can effectively be extracted from a sapphire substrate side, that is, an element lower surface side.

Figure 5:
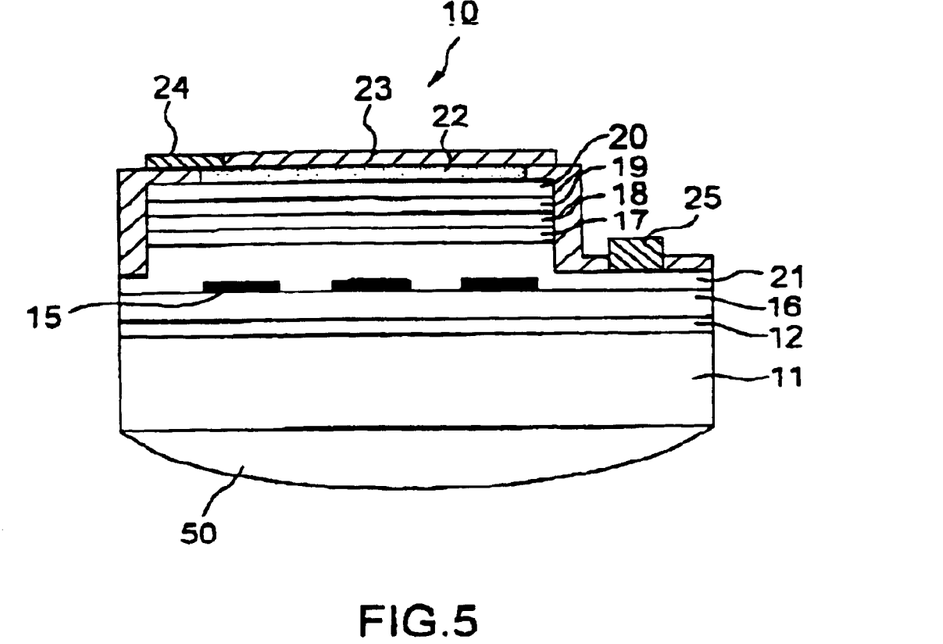
FIG. 5 is an element sectional view showing a modification example of the semiconductor light emitting element.

FIG. 5 shows a modification example of the semiconductor light emitting element shown in FIG. 1, and a light turning downward from the active layer 17 is positively utilized. Here, in order to enhance an extraction efficiency, a lens 50 is formed on the undersurface of the sapphire substrate 11.

Moreover, since it is unnecessary to extract the light from the surface, the transparent electrode necessary in the constitution of FIG. 1 is omitted, and the p-electrode 24 is directly connected to the contact layer 20. Therefore, contact resistance can be reduced.

By employing this constitution, it is possible to effectively extract the light from a back surface side which could not be extracted. Therefore, it is possible to manufacture a so-called flip chip mount type back surface emitting LED which performs light extraction from the back surface. Additionally, for flip chip mount, an assembly process is simplified, and a cost down effect is large.

Figure 6:
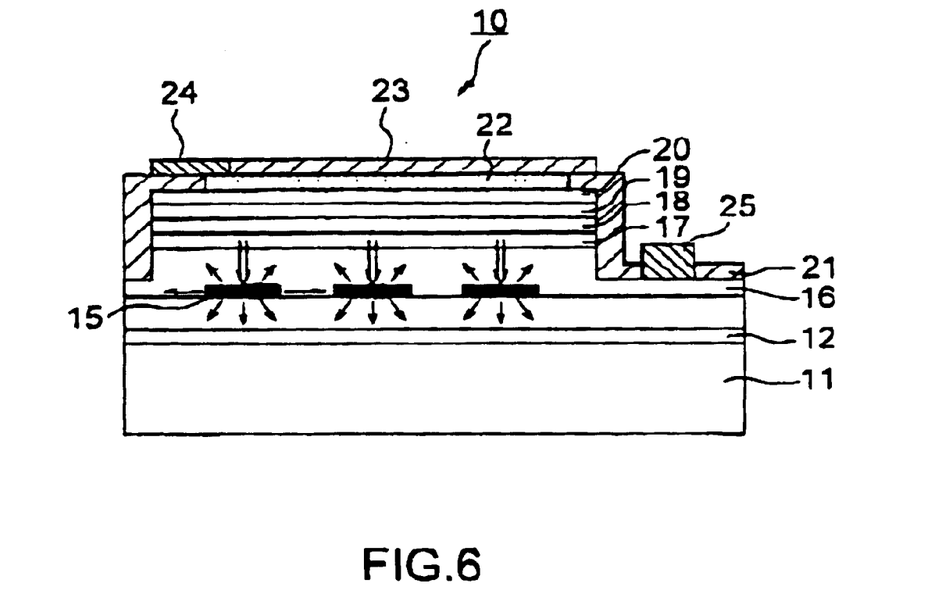
FIG. 6 is a schematic diagram showing a light emitting operation in the semiconductor light emitting element of a UV light emitting type.

FIG. 6 shows a light emitting operation in an example in which the present invention is applied to a UV light emitting LED. An ultraviolet ray is radiated in all directions from the active layer 18, but when the fluorescent substance in the ELO mask 15 is irradiated with the ultraviolet ray, the fluorescent substance serves as a light emitting substance to emit the visible light. In other words, the fluorescent substance acts as a visible light source.

Figure 7:
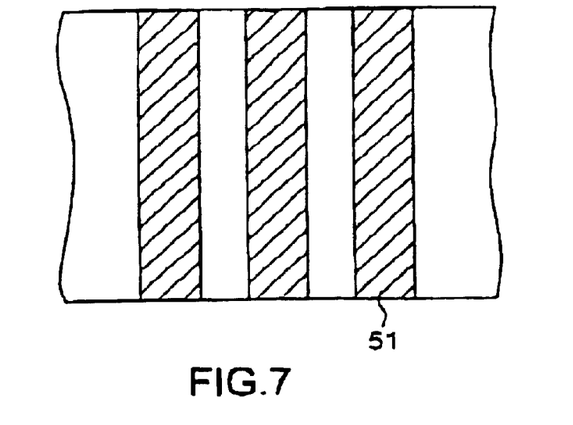
FIG. 7 is a plan view showing a pattern shape of a selective growth mask.
Figure 8:
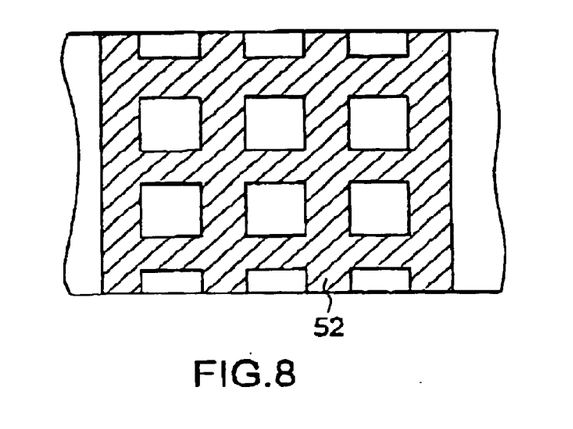
FIG. 8 is a plan view showing another pattern shape of the selective growth mask.
Figure 9:
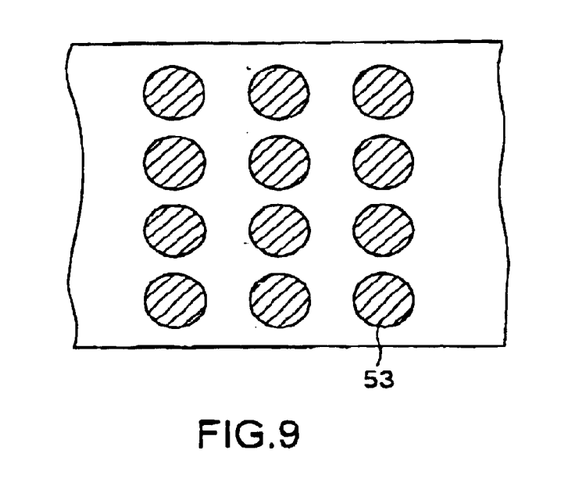
FIG. 9 is a plan view showing still another pattern shape of the selective growth mask.

FIGS. 7 to 9 show embodiments of a mask layer pattern, and patterns such as a strip pattern 51 shown in FIG. 7, a grid pattern 52 shown in FIG. 8, and a polka-dot pattern 53 shown in FIG. 9 can be selected.

Additionally, by appropriately selecting the fluorescent substance, blue light emission is perry in the active layer, and mixed color conversion to yellow can be performed by the fluorescent substance in the ELO mask.

FIGS. 10A to 10D are step sectional views showing a manufacture process of the semiconductor light emitting element according to the present invention.

Figure 10A:
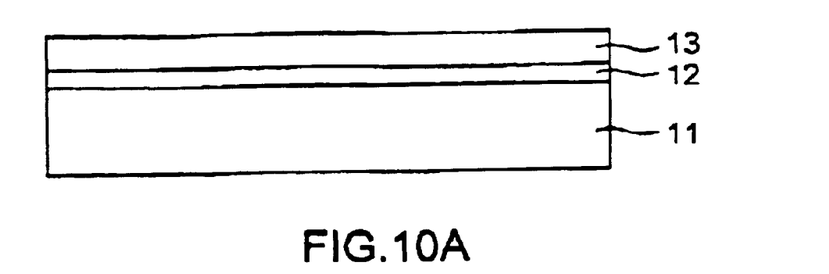
FIGS. 10A to 10D are step sectional views showing a manufacture process of the semiconductor light emitting element according to the present invention.

First, the sapphire substrate 11 is prepared, and the GaN buffer layer 12 and n-GaN layer 13 are successively grown on the surface of the substrate (FIG. 10A).

Figure 10B:
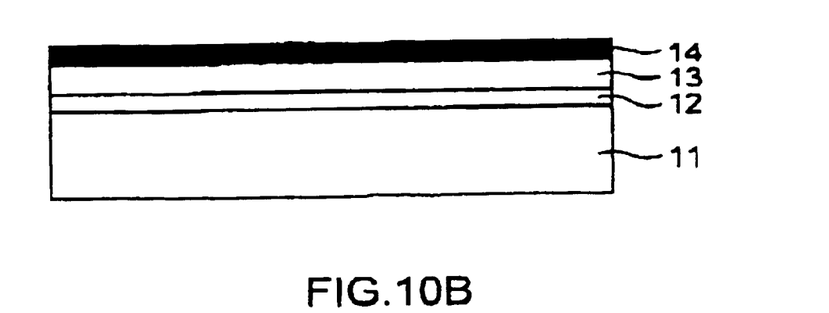

Subsequently, liquidized $SiO_2$, for example, a material obtained by uniformly mixing the fluorescent substance with a tradename OCD (manufactured by Tokyo Ohka Kogyo Co., Ltd.) is uniformly applied with a spinner or the like, and a mask layer 14 with a film thickness of 50 nm or more, 20 μm or less is formed (FIG. 10B). A material of this mask layer will be described later.

Figure 10C:
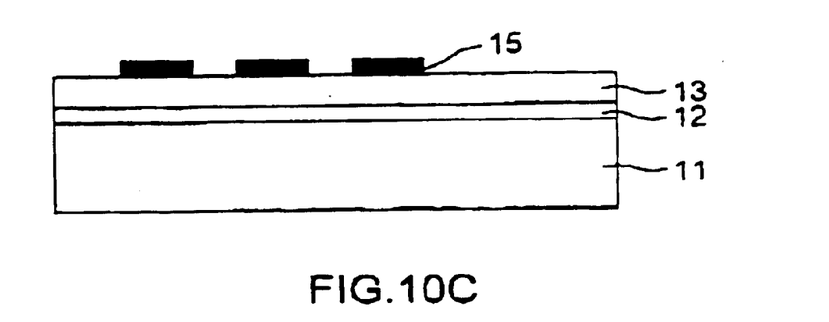

Subsequently, the mask layer 14 is patterned by photolithography, and the mask pattern 15 for ELO is formed (FIG. 10C).

Figure 10D:
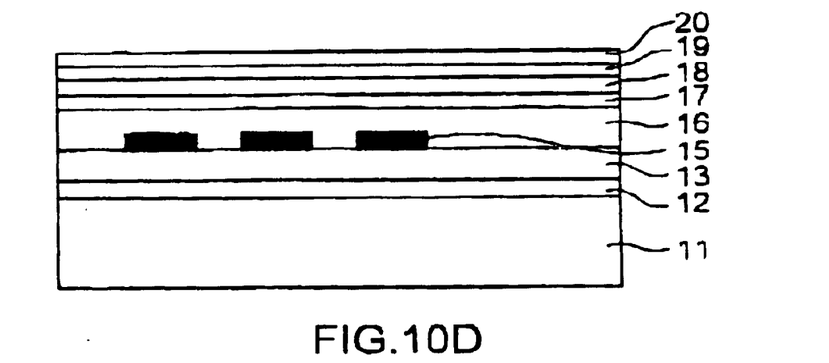

Moreover, this mask is used to perform ELO and grow the n-GaN layer 16, and further on the layer the InGaN active layer 17, p-AlGaN cap layer 18, p-GaN clad layer 19, and p$^+$-GaN contact layer 20 are successively grown (FIG. 10D).

Subsequently, a part of the element is etched an shown in FIG. 1 to expose an n-contact surface, the passivation film 21 is formed over the entire surface, a most part of the passivation film 21 on the p$^+$-GaN contact layer 20 is removed, the transparent electrode 22 is selectively formed in the part, and the passivation film 23 is formed to cover the transparent electrode 22. These passivation films 21 and 23 are mixed with the fluorescent substance.

Subsequently, by selectively removing the passivation films 21 and 23 to expose a part of the end of the transparent electrode and a part of the n-contact surface, and forming the p-electrode 24 and n-electrode 25 in respective places, the light emitting element 30 is obtained.

In this embodiment, the passivation films 21 and 23 are mixed with the fluorescent substance, but the mixing of the fluorescent substance only with the passivation film 23 on the transparent electrode is functionally sufficient, and the passivation film may contain no fluorescent substance.

Furthermore, instead of the passivation film 23 formed on the transparent electrode, a fluorescent layer may be formed.

To use the semiconductor light emitting element formed in this manner and manufacture the semiconductor light emitting apparatus, the semiconductor light emitting element is mounted on the mount member 31 such as a lead frame, the p-electrode 24 is connected to the frame 31 via the metal wire 33, the n-electrode 25 is connected to the lead 32 via the metal wire, and the semiconductor light emitting element 10 is filled with resin 34 or the like on the lead frame. The resin 34 can contain the fluorescent substance. By containing the entire element into the cap 35 at least a top surface of which is transparent, the semiconductor light emitting apparatus is completed.

Here, as the fluorescent substance mixed in the ELO mask pattern or the passivation film, for example, (Ba, Ca)B$_4$O$_7$ (tradename CMZ-152 manufactured by Asahi Chemical Industry Co., Ltd.) and (CaSr)$_2$P$_2$O$_7$ (tradename CMZ-165 manufactured by Asahi Chemical Industry Co., Ltd.) are used.

A fluorescent slurry for applying the fluorescent substance is prepared as follows.

By first preparing 1.5% of NC bander obtained by mixing 1.5 wt % of nitrocellulose (e.g., H12000 by Asahi Chemical Industry Co., Ltd.) with 98.5% of butyl acetate, mixing 100 g in total of a mixture of the aforementioned fluorescent substance (Ba, Ca)B$_4$O$_7$ (tradename CMZ-152 manufactured by Asahi Chemical Industry Co., Ltd.) and (CaSr)$_2$P$_2$O$_7$ (tradename CMZ-165 manufactured by Asahi Chemical Industry Co., Ltd.), 100 CC of the NC binder, and 5 CC of a binding agent mixture containing glass beads finely pulverized by milling, adding butyl acetate as a viscosity modifier to perform mixing/agitating for 24 hours or more, and passing the mixture through a 200 or 250 mesh filter, the fluorescent slurry is obtained.

This fluorescent slurry is applied. However, in a case in which a binding force is weak although sufficient milling is performed, an addition amount of NC binder is increased. When the binding force is excessively strong, a blend ratio of the fluorescent substance may be changed to solve the problem.

The applied fluorescent slurry is baked at a temperature of around 550° C. to solidify.

Additionally, without using such inorganic binder, an organic solvent or the like is used to apply the fluorescent substance, and the fluorescent substance can be left by performing heating to evaporate the solvent.

A described above, according to the semiconductor light emitting apparatus of the present invention, since the fluorescent substance is mixed beforehand in the selective growth mask material, it is possible to convert a part of the ultraviolet light emitted from the light emitting layer to the visible light in the vicinity of the active layer, and the light emitting efficiency of the entire light emitting apparatus can remarkably be enhanced.

Moreover, by further disposing a protective film containing the fluorescent substance on its topmost layer, the conversion efficiency to the visible light from the ultraviolet light is further enhanced, and the light emitting efficiency is further enhanced.

Furthermore, according to the manufacturing method of the semiconductor light emitting apparatus of the present invention, the selective growth mask containing the fluorescent substance is securely formed by evaporation of the inorganic binder and organic solvent, and the semiconductor light emitting element with a high light emitting efficiency can steadily be manufactured.

What is claimed is:

1. A semiconductor light emitting element comprising as a lamination structure:

an insulating substrate;

GaN-based stacked films stacked/formed on said insulating substrate, one of these films being a GaN-based film grown by using a selective growth mask material layer containing a fluorescent substance; and an active layer, formed on the GaN-based stacked films, for emitting at least a visible light component, wherein said fluorescent substance converts the visible light emitted by said active layer.

2. The semiconductor light emitting element according to claim 1, wherein said visible light emitted by said active layer mainly consists of a blue light.

3. The semiconductor light emitting element according to claim 1, wherein said fluorescent substance is (Ba, Ca)B$_4$O$_7$, (Ca, Sr)$_2$P$_2$O$_7$ or a mixture of them.

4. The semiconductor light emitting element according to claim 1, further comprising a protective film containing the fluorescent substance on a topmost layer.

5. The semiconductor light emitting element according to claim 1, wherein said light emitting layer includes an Al$_x$In$_y$Ga$_{1-x-y}$N ($0 \leq x \leq 0.1 \leq y \leq 1$) film, or a B$_2$Ga$_{1-z}$N ($0 \leq z \leq 1$) film.

6. The semiconductor light emitting element according to claim 1, wherein the selective growth mask material layer containing said fluorescent substance is formed in a stripe shape.

7. The semiconductor light emitting element according to claim 1, wherein the selective growth mask material layer containing said fluorescent substance is formed in a grid shape.

8. The semiconductor light emitting element according to claim 1, wherein the selective growth mask material layer containing said fluorescent substances formed in a polka-dot pattern.

9. The semiconductor light emitting element according to claim 1, further comprising a lens formed on a back surface side of said insulating substrate.

10. The semiconductor light emitting element according to claim 1, wherein a thickness of the mask layer containing said fluorescent substance is in a range of 50 nm to 20 µm.

* * * * *

UNITED STATES PATENT AND TRADEMARK OFFICE
CERTIFICATE OF CORRECTION

PATENT NO. : 6,791,118 B2
DATED : September 14, 2004
INVENTOR(S) : Furukawa et al.

It is certified that error appears in the above-identified patent and that said Letters Patent is hereby corrected as shown below:

Title page,
Item [75], Inventors, change "Nobuhir Suzuki" to -- Nobuhiro Suzuki --.

Signed and Sealed this

First Day of February, 2005

JON W. DUDAS
*Director of the United States Patent and Trademark Office*